(12) United States Patent
Tan et al.

(10) Patent No.: US 12,308,794 B2
(45) Date of Patent: May 20, 2025

(54) OSCILLATION WAVE GENERATION CIRCUIT AND CONSTRUCTION METHOD FOR THE SAME

(71) Applicant: Electric Power Research Institute of Yunnan Power Grid Co., Ltd., Kunming (CN)

(72) Inventors: Xiangyu Tan, Kunming (CN); Xianping Zhao, Kunming (CN); Wenyun Li, Kunming (CN); Guochao Qian, Kunming (CN); Yong Lu, Kunming (CN); Lijun Tang, Kunming (CN); Xiaowei Xu, Kunming (CN); Wenbin Zhang, Kunming (CN); Dada Wang, Kunming (CN); Zonghan Jiao, Kunming (CN)

(73) Assignee: Electric Power Research Institute of Yunnan Power Grid Co., Ltd., Kunming (CN)

( * ) Notice: Subject to any disclaimer, the term of this patent is extended or adjusted under 35 U.S.C. 154(b) by 0 days.

(21) Appl. No.: 18/579,492

(22) PCT Filed: Aug. 30, 2023

(86) PCT No.: PCT/CN2023/115849
§ 371 (c)(1),
(2) Date: Jan. 15, 2024

(87) PCT Pub. No.: WO2024/087873
PCT Pub. Date: May 2, 2024

(65) Prior Publication Data
US 2025/0007457 A1    Jan. 2, 2025

(30) Foreign Application Priority Data

Oct. 28, 2022  (CN) .......................... 202211334646.4

(51) Int. Cl.
*H03B 5/12*           (2006.01)
(52) U.S. Cl.
CPC .................................... *H03B 5/12* (2013.01)
(58) Field of Classification Search
CPC .................................. H03B 5/12; H02J 50/12
See application file for complete search history.

(56) References Cited

U.S. PATENT DOCUMENTS

| | | | |
|---|---|---|---|
| 6,724,155 B1* | 4/2004 | Flory, IV ............... | H05B 41/18 315/246 |
| 2008/0306326 A1* | 12/2008 | Epstein .................... | A61N 2/02 600/14 |
| 2023/0191145 A1* | 6/2023 | Gries ..................... | A61N 1/375 600/14 |

FOREIGN PATENT DOCUMENTS

| | | |
|---|---|---|
| CN | 105024585 A | 11/2015 |
| CN | 115133878 A | 9/2022 |
| CN | 115664049 A | 1/2023 |
| KR | 20160014176 A | 2/2016 |

* cited by examiner

*Primary Examiner* — Jeffrey M Shin
(74) *Attorney, Agent, or Firm* — IDEA Intellectual Limited; Margaret A. Burke; Sam T. Yip

(57) ABSTRACT

The present application provides an oscillation wave generating circuit and a construction method. The circuit includes: a high-voltage DC power supply, an energy storage capacitor, a thyristor, an isolation pulse transformer, a pulse control network, an LC resonant circuit, and a low-voltage DC power supply.

10 Claims, 3 Drawing Sheets

OSCILLATION WAVE GENERATION CIRCUIT AND CONSTRUCTION METHOD FOR THE SAME

FIELD OF THE INVENTION

The present application relates to the technical field of oscillation wave generation, and in particular to an oscillation wave generation circuit and construction method for the same.

BACKGROUND OF THE INVENTION

In the existing technology, a mechanical switch is used to control the start of the oscillation wave during the generation of the oscillation wave, and a freewheeling diode is used to provide electrical energy. However, the oscillation wave generated by the mechanical switch is affected by the spark, that is, the current fluctuation, during the switching process of the switch, resulting in poor waveform quality of the oscillation wave and a shorten service life of the oscillation wave generation circuit, while the freewheeling diode, which provides energy for the oscillation process, causes additional costs and increases the complexity of the oscillation wave generation circuit.

Thyristor is the abbreviation of thyristor, also known as silicon controlled rectifier, or thyristor for short. It is a semi-controlled device with the characteristics of high voltage resistance and strong flow energy. It is widely used in electronic circuits such as controllable rectification, AC voltage regulation, contactless electronic switches, inverters and frequency conversions. It is a typical device using small current to control large current.

SUMMARY OF THE INVENTION

In view of this, the purpose of the present application is to provide an oscillation wave generation circuit and a construction method for the same, using thyristor switches to excite the LC circuit to generate oscillation waves, and using energy storage capacitors to provide energy for the oscillation process, simplifying the circuit structure and avoiding the problem of poor quality of oscillation waveform caused by current fluctuations generated when the mechanical switch starts and stops the generation of the oscillation wave.

The embodiment of the present application provides an oscillation wave generation circuit, comprises:
high voltage DC power supply, energy storage capacitor, thyristor, isolation pulse transformer, pulse control network, LC resonant circuit, low voltage DC power supply;
wherein a positive electrode of the high-voltage DC power supply is respectively connected to a positive electrode of the energy storage capacitor, an anode of the thyristor and one end of the inductive element in the LC resonant circuit, another end of the inductive element is connected to a positive electrode of the capacitive element in the LC resonant circuit, a negative electrode of the capacitive element in the LC resonant circuit, a cathode of the thyristor, a secondary reference end of the isolation pulse transformer and a negative electrode of the energy storage capacitor are respectively connected to a negative electrode of the high-voltage DC power supply, a positive electrode of the low-voltage DC power supply is connected to a primary input terminal of the isolation pulse transformer, and a primary output terminal of the isolation pulse transformer is connected to a pulse output terminal of the pulse control network, a negative electrode of the pulse control network is connected to a negative electrode of the low-voltage DC power supply;
the thyristor acts as the circuit electronic switch of the LC resonant circuit and excites, after being reversely closed, the capacitive element and the inductive element in the LC resonant circuit to resonate and generate an oscillation wave.

Optionally, the high-voltage DC power supply is used to process the electric energy provided by an external power supply, and is used to charge the energy storage capacitor based on the processed electric energy to provide electric energy for the LC resonant circuit.

Optionally, the energy storage capacitor is used to store and compress the electric energy input by the high-voltage DC power supply, and provide a maintaining current for turning on the thyristor, and is use for resonating with the capacitive element and the inductive element in the LC resonant circuit after the thyristor is turned off.

Optionally, the isolation pulse transformer adopts an isolation design between the primary side and the secondary side to isolate the high and low voltage circuits, and control the on/off of the primary side of the isolation pulse transformer, and induce a high-frequency trigger pulse signal with a steep leading edge at the secondary side of the isolation pulse transformer.

Optionally, the pulse control network comprises a control chip and peripheral devices, and is used to control the primary side of the pulse transformer to close and open according to a preset frequency, and to induce a pulse drive signal on the secondary side of the pulse transformer to control the switching of the thyristor.

Optionally, the low-voltage DC power supply is used to provide electric energy for the primary side of the pulse transformer and the pulse control network.

Optionally, the LC resonant circuit is constructed under the principle of LC self-oscillation, for conducting the thyristor to excite the LC resonant circuit 26 to generate parallel resonance.

In another aspect, the present application provides a method for constructing an oscillation wave generation circuit, comprising:
determining the LC parameters of the target LC resonant circuit based on a preset parallel resonant frequency;
calculating the capacitance value of the target energy storage capacitor according to the LC parameters;
constructing the oscillation wave generation circuit based on the target LC resonant circuit and the target energy storage capacitor.

Optionally, the step of determining the LC parameters of the target LC resonant circuit based on the preset parallel resonant frequency comprises:
substituting the preset parallel resonant frequency into the RLC parallel resonant frequency formula to determine the LC parameter values of the target LC resonant circuit.

Optionally, the step of calculating the capacitance value of the target energy storage capacitor according to the LC parameters comprises:
determining the maximum value of the equivalent impedance of the target energy storage capacitor according to the LC parameters;
calculating the capacitance value of the target energy storage capacitor based on the maximum value.

In the oscillation wave generation circuit provided by the embodiment of the present application, a positive electrode of the high-voltage DC power supply is respectively connected to a positive electrode of the energy storage capacitor, an anode of the thyristor and one end of the inductive element in the LC resonant circuit, another end of the inductive element is connected to a positive electrode of the capacitive element in the LC resonant circuit, a negative electrode of the capacitive element in the LC resonant circuit, a cathode of the thyristor, a secondary reference end of the isolation pulse transformer and a negative electrode of the energy storage capacitor are respectively connected to a negative electrode of the high-voltage DC power supply, a positive electrode of the low-voltage DC power supply is connected to a primary input terminal of the isolation pulse transformer, and a primary output terminal of the isolation pulse transformer is connected to a pulse output terminal of the pulse control network, a negative electrode of the pulse control network is connected to a negative electrode of the low-voltage DC power supply; the thyristor acts as the circuit electronic switch of the LC resonant circuit and excites, after being reversely closed, the capacitive element and the inductive element in the LC resonant circuit to resonate and generate an oscillation wave. Compared with the existing technology, the use of energy storage capacitor as a freewheeling path can eliminate the need for freewheeling diodes, reduce costs, and have a simpler circuit structure; the oscillation wave generated by the thyristor electronic switch excitation circuit has good consistency, repeatability, waveform quality. There is no sparks and discharges during operation, therefore the circuit has long life and is safe to use.

In order to make the above-mentioned objectives, features and advantages of the present application easier to understand, following is a detailed description of the preferred embodiments, together with the accompanying drawings.

BRIEF DESCRIPTION OF THE DRAWINGS

In order to more clearly illustrate the technical solutions of the embodiments of the present application, the drawings required to be used in the embodiments will be briefly introduced below. It should be understood that the following drawings only show some embodiments of the present application and therefore should not be regarded as a limitation of the scope. For those of ordinary skilled in the art, other relevant drawings can also be obtained based on these drawings without exerting creative efforts.

DETAILED DESCRIPTION

In order to illustrate purpose, technical solutions and advantages of the embodiments of the present application, the technical solutions in the embodiments of the present application will be clearly and thoroughly described below with reference to the accompanying drawings in the embodiments of the present application. The components of the embodiments of the present application generally described and illustrated in the figures herein may be arranged and designed in various configurations. Therefore, the following detailed description of the embodiments of the application provided in the accompanying drawings is only for illustration purpose but not intended to limit the scope of the claimed application. Based on the embodiments of this application, every other embodiment obtained by those skilled in the art without any creative work shall fall within the scope of protection of this application.

First, the applicable scenarios of this application are introduced. This application can be applied to oscillation wave application scenarios.

Energy storage capacitors are used to replace freewheeling diodes as freewheeling paths, and thyristors are used to replace mechanical switches.

Figure 1:
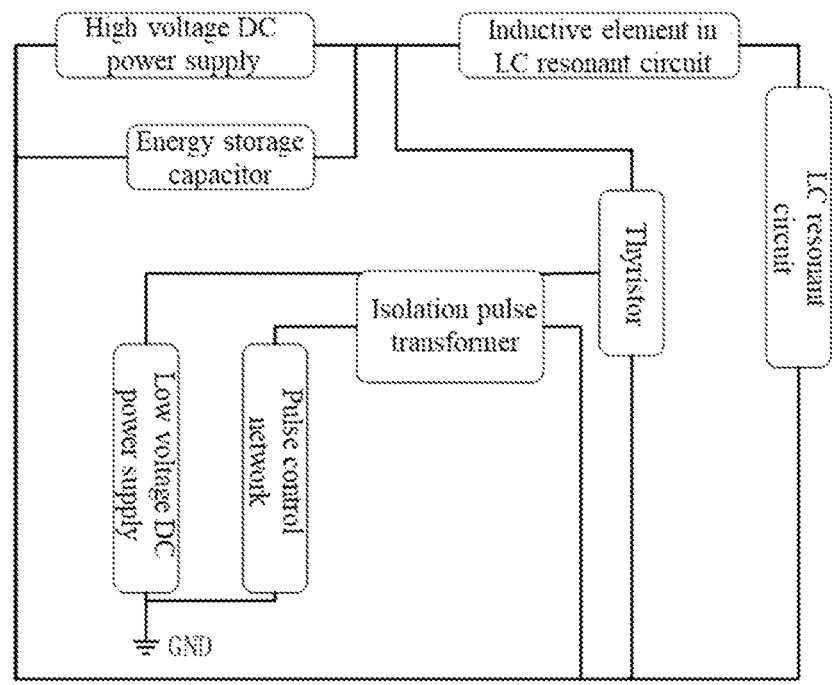
FIG. 1 shows a schematic connection diagram of an oscillation wave generation circuit provided by an embodiment of the present application.
Figure 2:
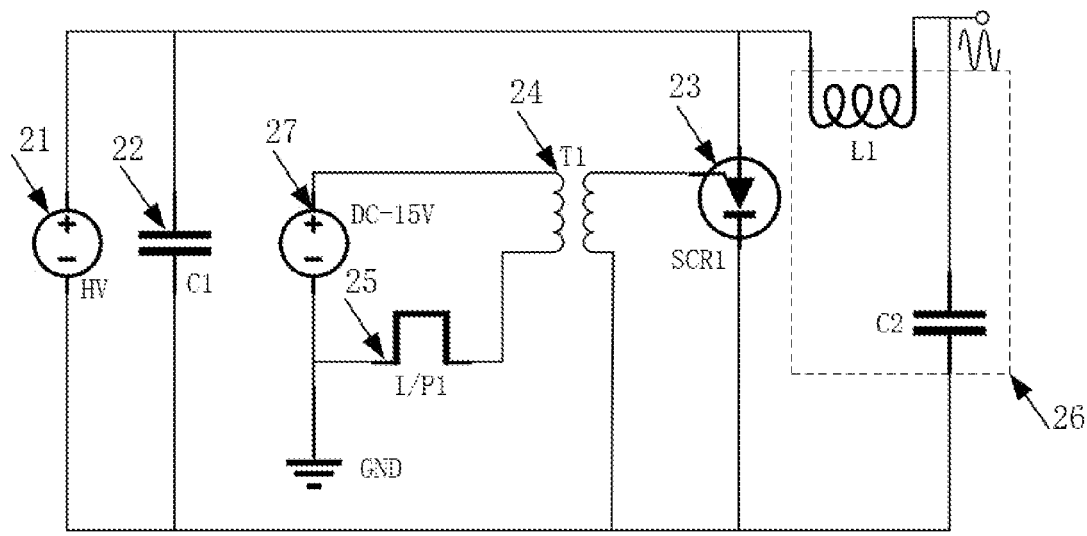
FIG. 2 shows a circuit diagram of an oscillation wave generation circuit provided by an embodiment of the present application.

Based on this, the embodiment of the present application provides an oscillation wave generation circuit, as shown in FIGS. 1-2. As shown, it includes:

High voltage DC power supply 21, energy storage capacitor 22, thyristor 23, isolation pulse transformer 24, pulse control network 25, LC resonant circuit 26, low voltage DC power supply 27;

Wherein, the positive electrode of the high-voltage DC power supply 21 is respectively connected to the positive electrode of the energy storage capacitor 22, the anode of the thyristor 23 and one end of the inductive element in the LC resonant circuit 26, another end of the inductive element is connected to a positive electrode of the capacitive element in the LC resonant circuit 26, a negative electrode of the capacitive element in the LC resonant circuit 26, a cathode of the thyristor 23, a secondary reference end of the isolation pulse transformer 24 and a negative electrode of the energy storage capacitor 22 are respectively connected to a negative electrode of the high-voltage DC power supply 21, a positive electrode of the low-voltage DC power supply 27 is connected to a primary input terminal of the isolation pulse transformer 24, and a primary output terminal of the isolation pulse transformer 24 is connected to a pulse output terminal of the pulse control network 25, a negative electrode of the pulse control network 25 is connected to a negative electrode of the low-voltage DC power supply 27.

The thyristor 23 acts as the circuit electronic switch of the LC resonant circuit 26 and excites, after being reversely closed, the capacitive element and the inductive element in the LC resonant circuit 26 to resonate and generate an oscillation wave.

Figure 3:
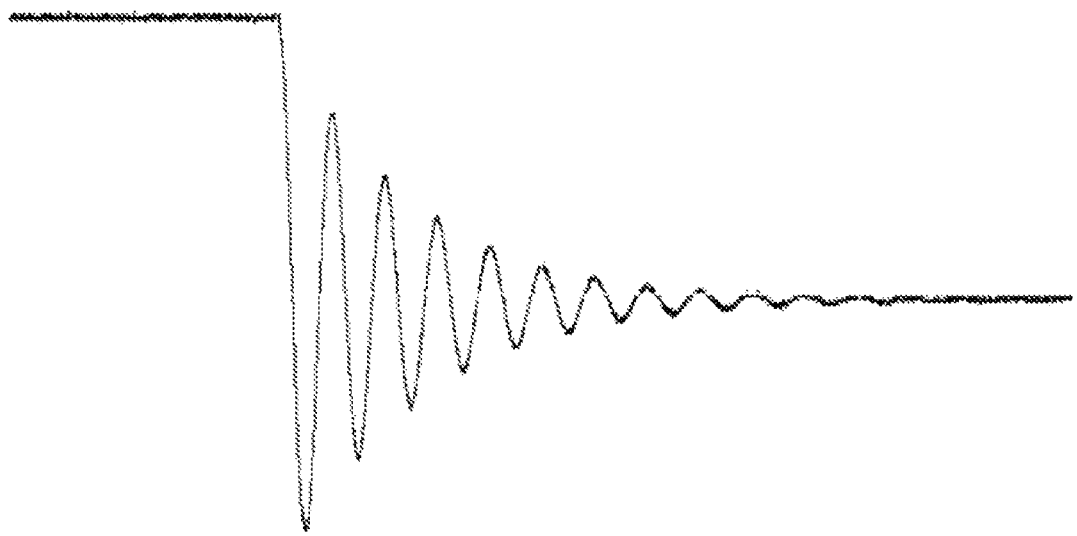
FIG. 3 shows a schematic diagram of an oscillating wave generated by an oscillating wave generation circuit provided by an embodiment of the present application.

The energy storage capacitor is used to replace a freewheeling diode to act as a freewheeling path, and the thyristor is used to replace a mechanical switch, which eliminates the freewheeling diode, reduces the cost, and has a simpler circuit structure. As shown in FIG. 3, the oscillation wave generated by the thyristor electronic switch excitation circuit has good waveform consistency, repeatability, waveform quality. There are no sparks or discharges during operation, therefore the circuit has a long life and is safe to use.

In a possible implementation, the high-voltage DC power supply 21 is used to process the electric energy provided by an external power supply, and is used to charge the energy storage capacitor 22 based on the processed electric energy to provide electric energy to the LC resonant circuit 26.

By way of example, after rectification, filtering, inversion, rectification and other processes, the electric energy provided by the external power supply is processed, and high voltage and small current are output, which is used to charge the energy storage capacitor 22 based on the processed electric energy, provide electrical energy to the LC resonant tank 26.

In a possible implementation, the energy storage capacitor 22 is used to store and compress the electric energy input by the high-voltage DC power supply 21, and provide a maintaining current for turning on the thyristor 23, and is use for resonating with the capacitive element and the inductive element in the LC resonant circuit 26 after the thyristor 23 is turned off.

By way of example, the output current of the high-voltage DC power supply 21 is relatively small and cannot meet the requirements of a conduction-maintaining current for the thyristor 23. The energy storage capacitor 22 stores the energy of the high-voltage DC power supply, provides the conduction-maintaining current to the thyristor 23, and provides a freewheeling path to the LC resonant circuit 26 the thyristor 23 is reversely turned off. Finally, a freewheeling path, which forms, together with the LC resonant circuit, a RLC self-excited oscillation to generate an oscillation wave.

By way of example, the energy storage capacitor 22 has the characteristics of high voltage rating and large capacity, and is used to store and compress the energy input by the high-voltage DC power supply 21 to provide the maintaining current required for turning on the thyristor 23, and provide high-frequency freewheeling path after the thyristor 23 is turned off, that is, providing a freewheeling path after the thyristor 23 is turned off.

In one possible implementation, the isolation pulse transformer 24 adopts an isolation design between the primary side and the secondary side to isolate the high and low voltage circuits, and control the on/off of the primary side of the isolation pulse transformer 24, and insulate a high-frequency trigger pulse signal induced by the secondary side of the isolation pulse transformer 24 which has a steep leading edge.

By way of example, the primary stage of the isolation pulse transformer 24 is controlled on and off, and a pulse trigger signal is induced at the secondary stage to control the conduction of the thyristor 23. The primary stage and the secondary stage adopt an isolation design to achieve electrical isolation between the low-voltage circuit at the control end and the high-voltage circuit of the oscillation wave.

By way of example, the secondary stage of the isolation pulse transformer 24 is connected to the control electrode of the thyristor 23, coupling the primary stage trigger signal to the secondary stage to control the turning on of the thyristor 23, and isolating the control terminal from the high-voltage circuit of the thyristor 23.

In a possible implementation, the pulse control network 25 comprises a control chip and peripheral devices, and is used to control the primary stage of the pulse transformer 24 to close and open according to a preset frequency, and induce a pulse driving signal at the secondary stage of the pulse transformer to control the switching of the thyristor 23.

By way of example, the pulse control network 25 is connected to the primary stage of the isolation pulse transformer 24, and controls the on/off of the primary stage of the isolation pulse transformer 24 to generate a pulse signal at the secondary stage to control the switching of the thyristor 23.

By way of example, the pulse control network 25 modulates and outputs a PWM wave to control the primary stage of the isolation pulse transformer 24 to generate a high-frequency pulsation signal, which is coupled to the secondary stage of the isolation pulse transformer 24 to control the switching of the thyristor 23.

In a possible implementation, the low-voltage DC power supply 26 is used to provide electric energy for the primary side of the pulse transformer 24 and the pulse control network 25.

In a possible implementation, the LC resonant circuit 26 is constructed under the principle of LC self-oscillation, for conducting the thyristor 23 to excite the LC resonant circuit 26 to generate parallel resonance.

By way of example, the principle of LC self-excited oscillation is used to control the conduction of the thyristor 23 to excite the LC resonant circuit to generate parallel resonance, and generate an oscillation wave of a specific amplitude at the parallel endpoint.

In a possible implementation, the thyristor 23 has the characteristics of high conduction capacity and high voltage rating. The thyristor 23 is a semi-controlled electronic switch, and there is no spark or discharge during operation.

By way of example, a thyristor. The thyristor includes a semiconductor substrate, a gate insulating layer, a main gate and a first side gate. The semiconductor substrate includes a main surface, and the main surface includes adjacent first and second regions with different doping types. The first region includes a third region having a first gap from the second region. The second region includes a fourth region having a second gap from the first region, the first gap and the second gap forming a channel region of the thyristor. The main gate is disposed on the gate insulating layer and at least partially corresponding to the channel region in a direction perpendicular to the main surface. The first side gate and the main gate are adjacently arranged on the gate insulating layer and insulated from each other. The thyristor's capability to control carriers in the channel region is enhanced through its side gate structure, allowing it to turn on and off quickly.

Figure 4:
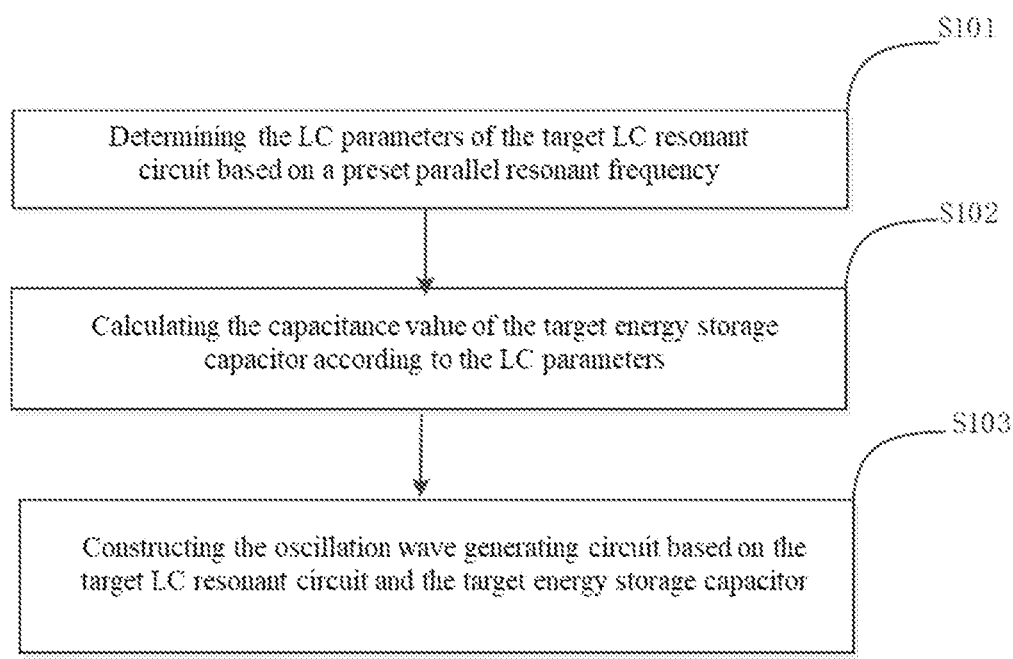
FIG. 4 shows a flow chart of a method for constructing an oscillation wave generation circuit provided by an embodiment of the present application.

In another aspect, as shown in FIG. 4, the present application provides a method for constructing an oscillation wave generation circuit, including:

S101: Determining the LC parameters of the target LC resonant circuit based on a preset parallel resonant frequency;

By way of example, based on different application environments and different scenario requirements, the LC parameters are optimized, and the LC parameter optimization design method of the rectifier circuit is divided into a rectifier part and a filter part. The rectifier part is based on the unidirectional conductivity of the diode or thyristor. To convert alternating current into direct current, the filter circuit filters out the alternating current component and retains the direct current component, changes the proportion of alternating current and direct current in the current, and reduces the pulsation of the output voltage, specifically including the following steps: Step 1: inserting an inductor in series with the filter circuit. The inductor has small impedance to DC and large impedance to AC, so it is connected in series with the resistor. When an inductor is connected in series to the rectifier circuit, when the voltage increases, the current in the inductor increases, and the inductor will store part of the magnetic field energy, and release the energy when the current decreases, smoothing the load current. And when the output current changes, the inductor will induce a counter electromotive force, which will increase the firing angle of the rectifier to avoid excessive impact current and prevent the current from changing. More importantly, it is to make the output voltage waveform continuous. Step 2: incorporating a capacitor into the filter circuit. The capacitor has a large resistance to DC and a small resistance to AC, so it is connected in parallel on both sides of the resistor. When the input voltage in the rectifier circuit increases, the capacitor is charged and part of the energy is stored in the capacitor. When the input voltage decreases, the capacitor discharges exponentially through the parallel resistor, releasing the stored energy and making the output voltage smoother. Step 3. Add inductors and capacitors to reshape the working condition of the filter circuit. After adding the inductor and capacitor, when a pair of diodes is turned on, the AC power supply passes through the diodes and is filtered by the inductor to filter out most of the AC components to the resistors and capacitors. When charging, the capacitor also bypasses the remaining AC component due to its low impedance to the AC component, reducing the AC component of the output voltage. When no diode is conducting, the electrical energy stored in the capacitor is released to the resistor, and the output voltage drops exponentially.

S102: Calculating the capacitance value of the target energy storage capacitor according to the LC parameters;

By way of example, a high-efficiency switching resonant voltage converter includes: a first LC resonant circuit and a second LC resonant circuit, wherein the first LC resonant circuit and the second LC resonant circuit are electrically connected to: a current sharing unit used to make the currents of the first LC resonant circuit and the second LC resonant circuit the same; and a switching unit for switching connection state of the first LC resonant circuit and the second LC resonant circuit to convert the input voltage into a set output voltage. During the voltage conversion process, under the action of the first transformer T1 and the second transformer T2, the currents of the first LC resonant circuit and the second LC resonant circuit remain synchronized, and when the current of the first LC resonant circuit is zero, the current of the second LC resonant circuit is also zero. Zero current switching can be realized without being limited by the actual parameter values of the resonant capacitor and resonant inductor, increasing component selectivity and reducing conversion losses.

S103: Constructing the oscillation wave generation circuit based on the target LC resonant circuit and the target energy storage capacitor.

By way of example, the oscillation wave generation circuit is constructed based on the target LC resonant circuit with determined LC parameters and the target energy storage capacitor with determined capacitance value. The constructed oscillation wave generation circuit uses the forward conduction of the thyristor to excite the LC resonant network to self-excite, and act as a freewheeling circuit to generate an oscillation wave on basis of the high-frequency characteristics of the energy storage capacitor. The oscillation wave generation circuit includes: the positive electrode of the high-voltage DC power supply 21 is respectively connected to the positive electrode of the energy storage capacitor 22, the anode of the thyristor 23 and one end of the inductive element in the LC resonant circuit 26, another end of the inductive element is connected to a positive electrode of the capacitive element in the LC resonant circuit 26, a negative electrode of the capacitive element in the LC resonant circuit 26, a cathode of the thyristor 23, a secondary reference end of the isolation pulse transformer 24 and a negative electrode of the energy storage capacitor 22 are respectively connected to a negative electrode of the high-voltage DC power supply 21, a positive electrode of the low-voltage DC power supply 27 is connected to a primary input terminal of the isolation pulse transformer 24, and a primary output terminal of the isolation pulse transformer 24 is connected to a pulse output terminal of the pulse control network 25, a negative electrode of the pulse control network 25 is connected to a negative electrode of the low-voltage DC power supply 27.

The thyristor 23 acts as the circuit electronic switch of the LC resonant circuit 26 and excites, after being reversely closed, the capacitive element and the inductive element in the LC resonant circuit 26 to resonate and generate an oscillation wave.

In a possible implementation, the step of determining the LC parameters of the target LC resonant circuit based on the preset parallel resonant frequency comprises:

substituting the preset parallel resonant frequency into the RLC parallel resonant frequency formula to determine the LC parameter values of the target LC resonant circuit.

In a possible implementation, the step of calculating the capacitance value of the target energy storage capacitor according to the LC parameters comprises:

determining the maximum value of the equivalent impedance of the target energy storage capacitor according to the LC parameters;

calculating the capacitance value of the target energy storage capacitor based on the maximum value.

By way of example, the specific calculation process of the LC parameters and the capacitance value is as follows:

RLC parallel resonant frequency:

$$f_0 = \frac{1}{2\pi\sqrt{LC}}\sqrt{1 - \frac{CR^2}{L}}$$

Circuit resonance conditions:

$$R < \sqrt{\frac{L}{C}}; X \gg R$$

The equivalent impedance of the energy storage capacitor in the LC resonant circuit:

$$X_{CE} = \frac{1}{2\pi f_0 C}$$

The parallel resonant frequency formula is:

$$f_0 = \frac{1}{2\pi\sqrt{LC}}\sqrt{1 - \frac{CR^2}{L}}$$

where, R is the dissipation resistance of the inductor coil. At low frequencies, the equivalent impedance of the energy storage capacitor is much larger than R. R can be ignored in the calculation. After the thyristor is turned off, the total resistance of the resonant circuit is approximately equal to $X_{CE}$, that is:

$$f_0 = \frac{1}{2\pi\sqrt{LC}}; X_{CE} < \sqrt{\frac{L}{C}}; X_L > > X_{CE}$$

When the LC parameter values are determined, the maximum value of the equivalent impedance $X_{CE}$ of the energy storage capacitor can be calculated, according to the formula:

$$X_{CE} < \sqrt{\frac{L}{C}}$$

And then according to $X_L >> X_{CE}$ a value 100 times smaller than $X_{CE}$ can be selected, and the energy storage capacitor value can be calculated through the formula:

$$X_{CE} = \frac{1}{2\pi f_0 C}$$

By way of example, when the existing current transformer is at high frequency, the parasitic inductance and resistance of the current transformer have a significant impact, making it less accurate when predicting overvoltage waveforms containing high-frequency components. The present invention includes a transformer low-frequency capacitance circuit. The transformer low-frequency capacitance circuit is connected to at least one high-frequency resonant circuit, that is, an RLC resonant circuit; the RLC resonant circuit is a parallel resonant circuit constructed with a capacitor Cn, a resistor Rn, and an inductor Ln, an equivalent circuit with a high-frequency resonant circuit is established. At least one high-frequency resonant circuit is connected to the low-frequency capacitance circuit of the transformer. The influence of the parasitic inductance and resistance of the current transformer can also be taken into account. When the primary voltage contains high-frequency components, the primary voltage can still be accurately calculated from the final screen current, which can effectively improve the inversion accuracy of the current transformer.

Figure 5:
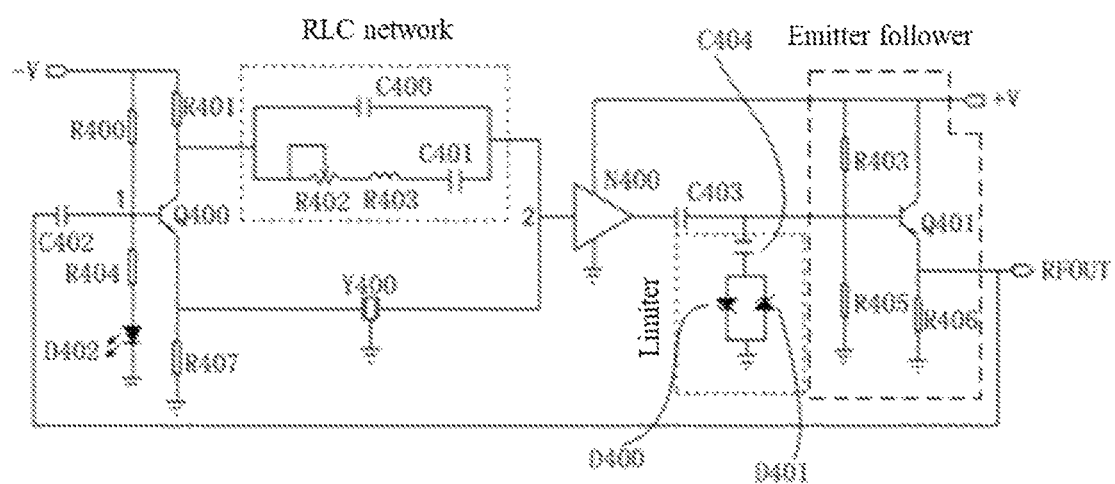
FIG. 5 shows a high-stability crystal oscillator circuit provided by an embodiment of the present application.

By way of example, as shown in FIG. 5, a high-stability crystal oscillator circuit uses an RLC network to replace the resistor on one arm of the bridge, eliminating the need to debug the tuning amplifier and achieving the same high-performance oscillation as the full-bridge circuit. The circuit includes a wideband amplifier, a double-arm bridge network connected to the wideband amplifier, an amplifier connected to the double-arm bridge network, and a limiter and emitter follower connected to the amplifier via DC blocking capacitor C403; the double-arm bridge network is composed of an RLC network and a crystal resonator Y400; one end of the crystal resonator Y400 is connected to a broadband amplifier, and the other end is connected to output terminal of the RLC network; the RLC network includes series-connected variable resistor R402, inductor L400, and capacitor C401, and the capacitor C400 connected in parallel at both ends of the series-connected variable resistor R402, inductor L400, and capacitor C401; wherein, the input terminal of the variable resistor R402 is connected to the broadband amplifier, and the output terminal of the capacitor C401 is connected to the input terminal of the amplifier N400; the capacitance value of the capacitor C400 is the same as the equivalent static capacitance of the crystal resonator Y400.

In this embodiment, the broadband amplifier includes a radio frequency transistor Q400 and a DC bias circuit thereof; an emitter of the radio frequency transistor Q400 is connected to the crystal resonator Y400.

The radio frequency transistor Q400 acts as an inverter to ensure that the oscillation signal passing through the crystal resonator Y400 and the signal passing through the RLC network A are in opposite phases, offsetting the resistive loss in the crystal frequency selection loop, and achieving the purpose of improving the loaded Q of the resonator loop.

In the bias circuit of the radio frequency transistor Q400, the light emitting diode D402 and the series connected resistor R404 are connected between the base of the radio frequency transistor Q400 and the ground to compensate for voltage change of the PN junction of the base emitter of the radio frequency transistor Q400 under high and low temperature conditions to achieve the purpose of stabilizing the static operating point of the radio frequency transistor Q400.

One end of the crystal resonator Y400 is connected to the emitter of the radio frequency transistor Q400, and the other end is connected to the collector of the radio frequency transistor Q400 through the RLC network, forming two arms of the bridge. The radio frequency signal is drawn out at the connection point 2 of the two arms and enters the amplifier N400. The RLC network is composed of a series connected resistor R402, an inductor L400, a capacitor C401 and a parallel connected capacitor C400. The capacitor C400 is used to balance the electrostatic capacitance of the crystal resonator Y400. The inductor L400 and the capacitor C401 resonate near the series resonant frequency of the crystal resonator Y400, adaptively adjust the variable resistor R402 to ensure the bridge balance and the circuit oscillation; the amplifier N400 is a high input impedance amplifier, and its input impedance is about 2 to 10 times the equivalent series resistance of the crystal resonator Y400 and acting a load resistance of the bridge. The amplifier can be constructed with any suitable integrated amplifier such as an operational amplifier, or a transistor differential amplifier circuit, and ensure sufficient gain to increase the loaded Q value of the bridge loop as much as possible, thereby improving frequency stability. The limiting circuit is constructed with a DC blocking capacitor C404 and an anti-parallel Schottky diode D400 and a Schottky diode D401, which limits the radio frequency signal and maintains the appropriate excitation current of the crystal resonator Y400. The oscillation loop phase can also be appropriately adjusted to maintain stable oscillation by properly adjusting the value of C404.

The base of the emitter follower Q401 is connected to the output terminal of the amplifier N400. The oscillation signal is input to its base and output from the emitter. The output signal is divided into two channels. One channel of the signal returns to the base of the main oscillator transistor through the feedback capacitor C402, and the other one channel of the signal is output as an output signal.

When the circuit is working, the radio frequency transistor Q400 provides a wide gain near the resonant frequency of the inductor L400 and the capacitor C401, but an extremely narrow "pit" appears at the crystal resonant frequency, so that the main oscillation circuit has negative feedback at frequencies outside the resonant frequency of the resonator, providing an extremely narrow positive feedback path near the crystal series resonance frequency. The circuit therefore oscillates with an oscillation frequency depending on the balance position of the bridge.

With the crystal resonator Y400 as an equivalent series resistor Rs and the variable resistor R402 having opposite signal phases, by adjusting the value of the variable resistor R402, the resistive loss of the frequency selection loop can be offset as much as possible to achieve the purpose of doubling the load Q value, further improve the frequency stability of the oscillation signal.

The RLC network resonates at the resonant frequency of the crystal resonator Y400, which can suppress unwanted spurious oscillations and other oscillation signals.

In the several embodiments provided in this application, it should be understood that the disclosed systems, devices and methods can be implemented in other ways. The device embodiments described above are only for illustration purpose. For example, the division of the units is only a logical functional division. In actual implementation, there may be other division methods. For example, multiple units or components may be combined or can be integrated into another system, or some features can be omitted, or not implemented. On the other hand, the coupling or direct coupling or communication connection between each other shown or discussed may be through some communication interfaces, and the indirect coupling or communication connection of the devices or units may be in electrical, mechanical or other forms.

The units described as separate components may or may not be physically separated, and the components shown as units may or may not be physical units, that is, they may be located in one place, or they may be distributed to multiple network units. Some or all of the units can be selected according to practical needs to achieve the purpose of the solution of this embodiment.

In addition, each functional unit in various embodiments of the present application may be integrated into one processing unit, or each unit may exist physically alone, or two or more units may be integrated into one unit.

If the functions are implemented in the form of software functional units and sold or used as independent products, they can be stored in a non-volatile computer-readable storage medium that is executable by a processor. Based on this understanding, the technical solution of the present application is essentially or the part that contributes to the existing technology or the part of the technical solution can be embodied in the form of a software product. The computer software product, including several instructions, can be stored in a storage medium and used to cause a computer device (which may be a personal computer, a server, or a network device, etc.) to execute all or part of the steps of the methods described in various embodiments of this application. The aforementioned storage media include: U disk, mobile hard disk, read-only memory (ROM), random access memory (RAM), magnetic disk or optical disk and other media that can store program code.

Finally, it should be noted that the above-mentioned embodiments are only specific implementation modes of the present application, and are used to illustrate, but not to limit, the technical solutions of the present application. The protection scope of the present application is not limited thereto. Although the present application has been described in detail by referring to the foregoing embodiments, those ordinary skilled in the art should understand that any person familiar with the technical field can modify or easily change the technical solutions recorded in the foregoing embodiments within the technical scope disclosed in the present application, or to make equivalent substitutions for some of the technical features; and these modifications, changes or substitutions do not cause the essence of the corresponding technical solutions to deviate from the spirit and scope of the technical solutions of the embodiments of this application, and they should all be covered by the scope of protection of the present application. Therefore, the protection scope of this application should be subject to the protection scope of the claims.

What is claimed is:

1. An oscillation wave generation circuit, characterized in comprising:
   a high-voltage DC power supply, an energy storage capacitor, a thyristor, an isolation pulse transformer, a pulse control network, a LC resonant circuit, a low-voltage DC power supply;
   wherein, a positive electrode of the high-voltage DC power supply is respectively connected to a positive electrode of the energy storage capacitor, an anode of the thyristor and one end of the inductive element in the LC resonant circuit, another end of the inductive element is connected to a positive electrode of the capacitive element in the LC resonant circuit, a negative electrode of the capacitive element in the LC resonant circuit, a cathode of the thyristor, a secondary reference end of the isolation pulse transformer and a negative electrode of the energy storage capacitor are respectively connected to a negative electrode of the high-voltage DC power supply, a positive electrode of the low-voltage DC power supply is connected to a primary input terminal of the isolation pulse transformer, and a primary output terminal of the isolation pulse transformer is connected to a pulse output terminal of the pulse control network, a negative electrode of the pulse control network is connected to a negative electrode of the low-voltage DC power supply;
   the thyristor acts as the circuit electronic switch of the LC resonant circuit and excites, after being reversely closed, the capacitive element and the inductive element in the LC resonant circuit to resonate, generate an oscillation wave.

2. The oscillation wave generation circuit according to claim 1, characterized in that, the high-voltage DC power supply is used to process the electric energy provided by an external power supply, and is used to charge the energy storage capacitor based on the processed electric energy to provide electric energy for the LC resonant circuit.

3. The oscillation wave generation circuit according to claim 1, characterized in that, the energy storage capacitor is used to store and compress the electric energy input by the high-voltage DC power supply, and provide a maintaining current for turning on the thyristor, and is use for resonating with the capacitive element and the inductive element in the LC resonant circuit after the thyristor is turned off.

4. The oscillation wave generation circuit according to claim 1, characterized in that, the isolation pulse transformer adopts an isolation design between the primary side and the secondary side to isolate the high and low voltage circuits, and control the on/off of the primary side of the isolation pulse transformer, and induce a high-frequency trigger pulse signal with a steep leading edge at the secondary side of the isolation pulse transformer.

5. The oscillation wave generation circuit according to claim 1, characterized in that, the pulse control network comprises a control chip and peripheral devices, and is used to control the primary side of the pulse transformer to close and open according to a preset frequency, and to induce a pulse drive signal on the secondary side of the pulse transformer to control the switching of the thyristor.

6. The oscillation wave generation circuit according to claim 4, characterized in that, the low-voltage DC power supply is used to provide electric energy for the primary side of the pulse transformer and the pulse control network.

7. The oscillation wave generation circuit according to claim 1, characterized in that, the LC resonant circuit is constructed under the principle of LC self-oscillation, for conducting the thyristor to excite the LC resonant circuit to generate parallel resonance.

8. A method of constructing an oscillation wave generation circuit comprising:
   determining LC parameters of a target LC resonant circuit based on a preset parallel resonant frequency;
      calculating a capacitance value of a target energy storage capacitor according to the LC parameters;
      constructing an oscillation wave generation circuit based on the target LC resonant circuit and the target energy storage capacitor.

9. The method according to claim 8, characterized in that, the step of determining the LC parameters of the target LC resonant circuit base on the present parallel resonant frequency comprises:
   substituting the preset parallel resonant frequency into the RLC parallel resonant frequency formula to determine the LC parameter values of the target LC resonant circuit.

10. The method according to claim 8, characterized in that, the step of calculating the capacitance value of the target energy storage capacitor according to the LC parameters comprises:
   determining the maximum value of the equivalent impedance of the target energy storage capacitor according to the LC parameters;
   calculating the capacitance value of the target energy storage capacitor based on the maximum value.

* * * * *